United States Patent
Conte et al.

(10) Patent No.: US 8,385,135 B2
(45) Date of Patent: Feb. 26, 2013

(54) LOW CONSUMPTION VOLTAGE REGULATOR FOR A HIGH VOLTAGE CHARGE PUMP, VOLTAGE REGULATION METHOD, AND MEMORY DEVICE PROVIDED WITH THE VOLTAGE REGULATOR

(75) Inventors: Antonino Conte, Tremestieri Etneo (IT); Alberto Jose Di Martino, Palagonia (IT); Enrico Castaldo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 212 days.

(21) Appl. No.: 12/881,940

(22) Filed: Sep. 14, 2010

(65) Prior Publication Data
US 2011/0069562 A1    Mar. 24, 2011

(30) Foreign Application Priority Data
Sep. 18, 2009    (EP) ..................... 09425361

(51) Int. Cl.
*G11C 5/14*    (2006.01)
*G05F 3/08*    (2006.01)

(52) U.S. Cl. .................... 365/189.09; 323/311

(58) Field of Classification Search ............. 365/189.09, 365/185.18; 323/311
See application file for complete search history.

(56) References Cited

U.S. PATENT DOCUMENTS

| 5,822,247 | A  * | 10/1998 | Tassan Caser et al. .. 365/185.18 |
| 7,403,441 | B2 * | 7/2008  | Castaldo et al. ............. 365/226 |
| 2004/0071031 | A1 | 4/2004 | Butler et al. |
| 2007/0210853 | A1 | 9/2007 | Maejima |
| 2008/0007321 | A1 * | 1/2008 | Castaldo et al. ............. 327/536 |
| 2008/0037301 | A1 | 2/2008 | Fontana et al. |
| 2009/0184697 | A1 | 7/2009 | Park |

* cited by examiner

*Primary Examiner* — Hoai V Ho
*Assistant Examiner* — Tri Hoang
(74) *Attorney, Agent, or Firm* — Seed IP Law Group PLLC

(57) ABSTRACT

A voltage regulator for a regulated voltage generator configured to generate an operating voltage and including a variable comparison voltage generator, a comparison voltage, a partition branch including a plurality of active devices of a resistive type to receive the operating voltage and supply an intermediate voltage correlated to the operating voltage, and a comparator, to receive the comparison voltage and the intermediate voltage and supply a regulation signal for the regulated-voltage generator.

24 Claims, 6 Drawing Sheets

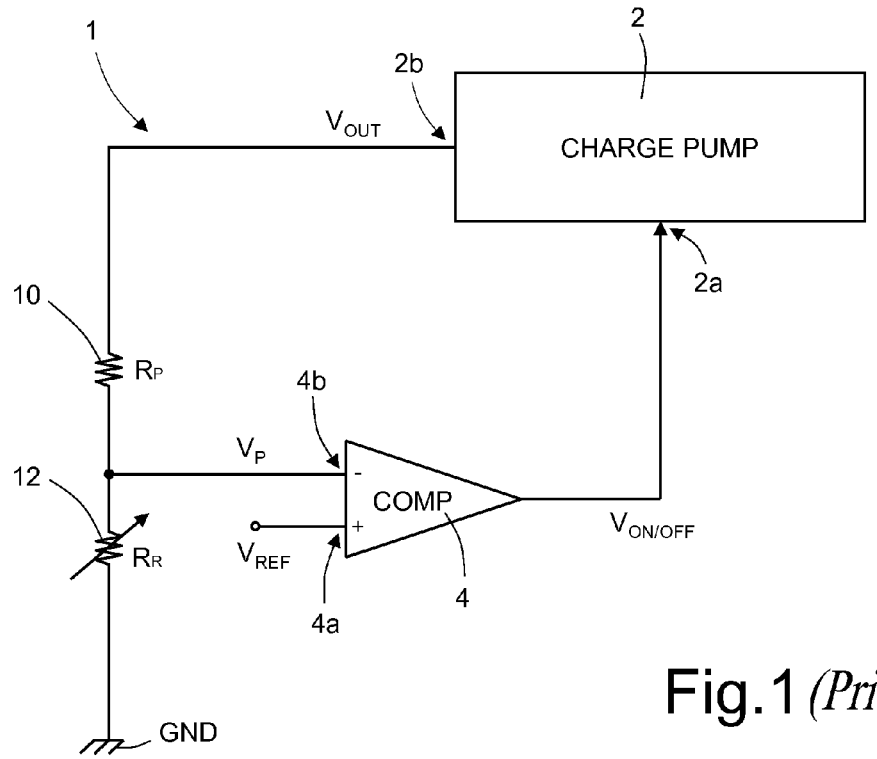
Fig.1 *(Prior Art)*
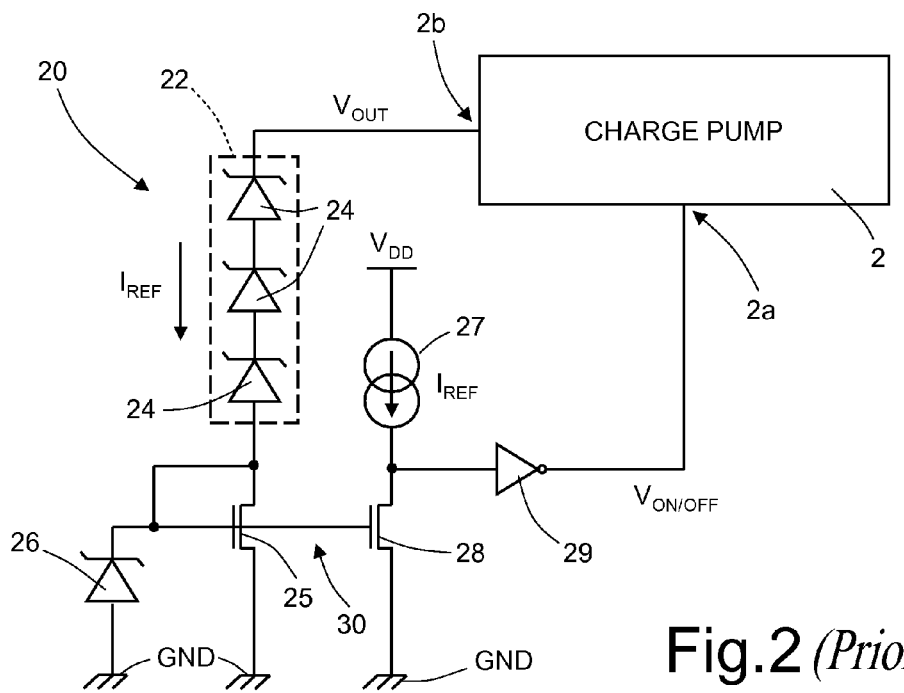
Fig.2 *(Prior Art)*

LOW CONSUMPTION VOLTAGE REGULATOR FOR A HIGH VOLTAGE CHARGE PUMP, VOLTAGE REGULATION METHOD, AND MEMORY DEVICE PROVIDED WITH THE VOLTAGE REGULATOR

BACKGROUND

1. Technical Field

The present disclosure relates to a low consumption voltage regulator and to a voltage regulation method, in particular for regulating the output voltage of a high voltage charge pump and to a memory device provided with the voltage regulator.

2. Description of the Related Art

As is known, charge pumps are typically used in circuits that require internal operating voltages higher than the supply voltage, as, for example, in the case of non-volatile EPROM and FLASH memories, where the programming and erasure voltages are of approximately 12-14 V, whilst the supply voltage is of approximately 1-3 V. Operation of a charge pump is based upon the transfer of charge from a supply pin (biased at the supply voltage) to an output stage of the charge pump, including an accumulation capacitor configured for accumulating the transferred charge, consequently increasing the value of an output voltage that is set up across it. The output voltage depends upon the charge transferred. In order to regulate automatically the amount of current supplied to the accumulation capacitor to maintain the voltage across it constant, it is common to use a voltage regulator circuit configured for detecting the voltage at output from the charge pump (or a voltage proportional to the output voltage) and controlling in feedback the current supplied to the accumulation capacitor in order to maintain the output voltage at a desired value, substantially constant.

Operation of a regulator circuit generally envisages comparison of a division of the output voltage (or of a respective output current) with a reference voltage (or with a respective reference current), which represents the voltage (or current) that it is desired to obtain. The result of the comparison is a state signal, which indicates that a desired level of output voltage has been reached and is configured for acting on the charge pump for interrupting transfer of charge towards the accumulation capacitor.

However, for low supply voltages, generally between approximately 1 V and 1.4 V, the charge pumps lose efficiency, reaching values of inefficiency factor $I_{factor}$ of 60 or higher. The inefficiency factor $I_{factor}$ is given by the ratio between the current required of the supply by the charge pump and the current delivered by the charge pump. The current required by the regulator circuit (which in effect represents part of the load of the charge pump) to the charge pump results in a corresponding current required of the supply by the charge pump multiplied by the inefficiency factor $I_{factor}$.

Limiting the current consumption of the regulator circuit is consequently of fundamental importance.

FIG. 1 shows a resistive-divider regulator circuit 1, of a known type, configured for generating at output an enabling signal for the transfer of charge $V_{ON/OFF}$, and connected to a charge pump 2, which is also of a known type, designed to receive on an input terminal 2a the signal for enabling charge transfer $V_{ON/OFF}$ and generating on an output terminal 2b a charge signal $V_{OUT}$. The regulator circuit 1 includes a comparator 4 configured for receiving on a first input 4a a reference signal $V_{REF}$ and on a second input 4b a comparison signal $V_P$, given by a division of the charge signal $V_{OUT}$, and for generating at output the signal for enabling charge transfer $V_{ON/OFF}$ on the basis of the comparison between the comparison signal $V_P$ and the reference signal $V_{REF}$. The regulator circuit 1 moreover includes a first reference resistor 10, connected between the output terminal 2b of the charge pump 2 and the second input 4b of the comparator 4, and a second reference resistor 12, having an adjustable resistance value, connected between the second input 4b of the comparator 4 and a ground terminal GND. The first and second reference resistors 10 and 12 hence form a resistive divider of the charge signal $V_{OUT}$. In particular, the comparison signal $V_P$ is the division of the charge signal $V_{OUT}$ taken on the second reference resistor 12. The charge signal $V_{OUT}$ of FIG. 1 is a voltage signal, and its desired value is given by the following formula (1):

$$V_{OUT} = V_{REF} \cdot (1 + R_P/R_R) \quad (1)$$

where $R_P$ is the resistance value of the first reference resistor 10 and $R_R$ is the resistance value of the second reference resistor 12.

The regulator circuit 1 of FIG. 1 presents some disadvantages, above all in the case where it is desired to maintain low levels of consumption (for example, consumption levels of approximately 1 μA). In fact, for the purpose it would be necessary to increase the value of the resistances $R_P$ and $R_R$, for example to values equal to or higher than 10 MΩ. However, this is not always possible, since the resistance values would require a considerable occupation of area, which is scarcely available in circuits of an integrated type.

FIG. 2 shows a regulator circuit 20 of a known type, alternative to the regulator circuit 1 of FIG. 1, and in particular affording the advantage of requiring low consumption levels irrespective of the area occupied.

The regulator circuit 20 of FIG. 2 drives a charge pump 2 by means of a signal for enabling transfer of charge $V_{ON/OFF}$, as has already been described with reference to FIG. 1. However, in this case, the charge signal $V_{OUT}$ is a voltage designed to bias a reference branch 22 of the regulator circuit 20. The reference branch 22 includes a plurality of Zener diodes 24 (three Zener diodes 24 are illustrated in the figure), which are biased by a reference current $I_{REF}$. The reference branch 22 is connected to a ground terminal GND via a first mirror transistor 25, having diode configuration, i.e., with the control terminal connected to its own source terminal. Furthermore, the control terminal of the mirror transistor 25 is connected to the ground terminal GND via a Zener diode 26.

The reference current $I_{REF}$ is generated by means of a current generator 27 having a first terminal connected to a supply voltage $V_{DD}$ and a second terminal connected to a conduction terminal of a second mirror transistor 28. The first and second mirror transistors 25 and 28 are moreover connected to one another in current mirror configuration 30. Furthermore, the second terminal of the current generator 27 is connected to an inverter 29, which generates at its output the signal for enabling transfer of charge $V_{ON/OFF}$ supplied at an input 2a to the charge pump 2. In use, when the charge voltage $V_{OUT}$ does not exceed a regulation voltage value (desired voltage), the reference branch 22 is traversed by a current having a value equal to the reference current $I_{REF}$. The signal for enabling charge transfer $V_{ON/OFF}$ generated at output by the inverter 29 governs the charge pump 2 in normal operating conditions (i.e., the charge voltage $V_{OUT}$ on the output 2b of the charge pump 2 increases). When the voltage $V_{OUT}$ exceeds the value of the regulation voltage, the current on the reference branch 22 increases. The current is thus brought at input to the inverter 29 via the current mirror 30.

The signal for enabling charge transfer $V_{ON/OFF}$ switches and governs the charge pump into the inhibited operating condition. When the voltage $V_{OUT}$ on the output of the charge pump 2 drops below the regulation voltage value, normal operation of the charge pump 2 resumes.

The regulator circuit 20, however, presents some disadvantages. In the first place, it is evident how the regulation voltage depends upon the characteristics and upon the number of Zener diodes used and is not regulatable during use. In particular, the difficulty and costs of production, as likewise the effect of the inter-die process dispersions, increase with the number of Zener diodes used. Furthermore, since the regulation voltage is proportional to the number of Zener diodes used, it proves problematical to implement a fine adjustment to compensate for any possible inter-die dispersions of electronic circuits, such as for example, memory cells (not illustrated) to which the output of the charge pump 2 may be connected in use.

BRIEF SUMMARY

The aim of the present disclosure is to provide a low consumption voltage regulator, a voltage regulation method, and a memory device provided with the voltage regulator that will be free from the drawbacks of the known art.

According to the present disclosure a low consumption voltage regulator, a voltage regulation method, and a memory device provided with the voltage regulator are consequently provided.

In accordance with one aspect of the present disclosure, a voltage regulator for a regulated voltage generator configured for generating an operating voltage is provided. The voltage regulator includes a variable comparison voltage generator, configured for generating at its output a comparison voltage; a partition branch including a plurality of active devices of a resistive type, configured for receiving at input the operating voltage and supplying at output an intermediate voltage correlated to the operating voltage; and a comparator, configured for receiving at input the comparison voltage and the intermediate voltage and supplying at output a regulation signal for the regulated voltage generator.

In accordance with another aspect of the present disclosure, the voltage regulator includes a first current generator, connected to the output of the variable comparison voltage generator, and configured to generate a controlled current correlated to the comparison voltage; and a current mirror circuit, configured for supplying to the partition branch a regulated current of a value proportional to the controlled current.

In accordance with another aspect of the present disclosure, the current mirror circuit above includes a first mirror transistor, having a drain terminal connected to the first current generator and a source terminal connected to a ground-reference line; and a second mirror transistor, having a drain terminal connected to the partition branch and a source terminal connected to the ground-reference line, the first mirror transistor and second mirror transistor each having a respective control terminal connected to one another.

In accordance with another aspect of the present disclosure, the first current generator referred to above is a transistor having a first conduction terminal connected to the output of the variable comparison voltage generator, a second conduction terminal connected to the drain terminal of the first mirror transistor, and a control terminal connected to the ground reference line, the voltage regulator moreover comprising a biasing structure including a first biasing transistor and a second current generator, the first biasing transistor having a first conduction terminal connected to the second current generator and a second conduction terminal connected to the second conduction terminal of the first current generator.

In accordance with another aspect of the present disclosure, the biasing structure referred to above includes a second biasing transistor having a first conduction terminal connected to the partition branch and a second conduction terminal connected to the drain terminal of the second mirror transistor; and a third current generator connected to the drain terminal of the second mirror transistor.

In accordance with yet a further aspect of the present disclosure, a method for regulation of an operating voltage generated by a regulated-voltage generator is provided. The method includes the steps of generating a comparison voltage by means of a variable comparison voltage generator; generating an intermediate voltage, depending upon the operating voltage, by means of a partition branch; comparing the comparison voltage with the intermediate voltage; and generating a regulation signal for the regulated voltage generator on the basis of a result of the comparison.

In accordance with another aspect of the foregoing method, the method includes controlling in conduction a first current generator by means of the comparison voltage so as to generate a controlled current; and mirroring on the partition branch, by means of a current mirror circuit, the controlled current so as to generate on the partition branch a regulated current of a value proportional to the controlled current.

In accordance with still yet a further aspect of the foregoing method, the first current generator is a transistor having a first conduction terminal, a second conduction terminal, and a control terminal, and the step of controlling the first current generator in conduction includes controlling the control terminal with a ground voltage; controlling the first conduction terminal with the comparison voltage; and controlling the second conduction terminal with a biasing voltage having a value intermediate between the value of the ground voltage and the value of the comparison voltage.

In accordance with still yet a further aspect of the present disclosure, a memory device is provided that includes an array of memory cells; a read/write circuit coupled to the array of memory cells; a regulated voltage generator, configured for generating an operating voltage; and a circuit for managing the supply coupled to the read/write circuit and including: a reference voltage generator; a voltage regulator coupled to the reference voltage generator and to the regulated-voltage generator; a control logic block coupled to the voltage regulator and configured for controlling the voltage regulator in the generation of a regulation signal, the regulation signal in turn controlling the regulated voltage generator in the generation of the operating voltage; and the voltage regulator comprising a variable comparison voltage generator, configured for generating at its output a comparison voltage; a partition branch including a plurality of active devices of a resistive type, configured for receiving at input the operating voltage and supplying at output an intermediate voltage correlated to the operating voltage; and a comparator, configured for receiving at input the comparison voltage and the intermediate voltage and supplying at output a regulation signal for the regulated voltage generator.

In accordance with yet a further aspect of the present disclosure, a circuit is provided that includes a regulated voltage generator circuit; a circuit to generate a variable comparison voltage; a circuit comprising a partition circuit to generate an intermediate voltage that is dependent on an operating voltage; and a circuit to compare the comparison voltage and the intermediate voltage and to generate a control signal.

BRIEF DESCRIPTION OF THE SEVERAL VIEWS OF THE DRAWINGS

For a better understanding of the present disclosure, a preferred embodiment is now described purely by way of non-limiting example, with reference to the attached drawings, wherein:

FIG. 1 shows a voltage regulator circuit for a resistive-divider charge pump according to one known type;

FIG. 2 shows a voltage regulator circuit for a Zener diode charge pump according to a further known type;

DETAILED DESCRIPTION

Figure 3:
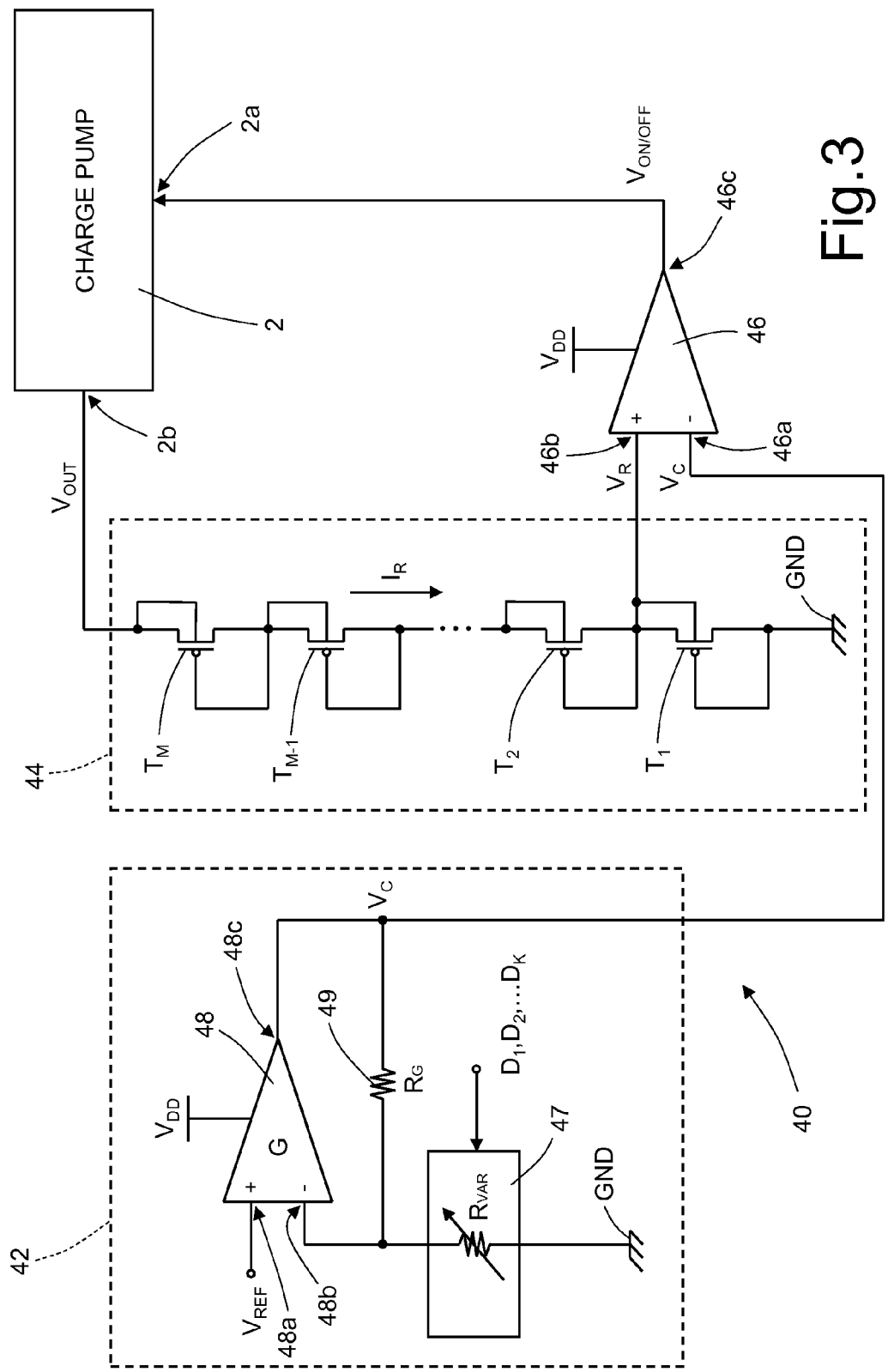
FIG. 3 shows a voltage regulator circuit for a charge pump according to one embodiment of the present disclosure.

FIG. 3 illustrates a regulator circuit 40 according to one embodiment of the present disclosure.

The regulator circuit 40 includes a reference generation block 42, configured to supply at an output a first comparison signal $V_C$; a regulation block 44, configured to supply at output a second comparison signal $V_R$; and a comparator device 46 configured to receive on a first input 46a the first comparison signal $V_C$ and on a second input 46b the second comparison signal $V_R$, and to supply at an output 46c a signal for enabling charge transfer $V_{ON/OFF}$ for a charge pump 2 of a known type, which is configured to generate at an output a charge signal $V_{OUT}$, as already illustrated in FIGS. 1 and 2 and described above. The first comparison signal $V_C$, the second comparison signal $V_R$, and the charge signal $V_{OUT}$ are, in the embodiment described in FIG. 3, voltage signals.

Figure 4:
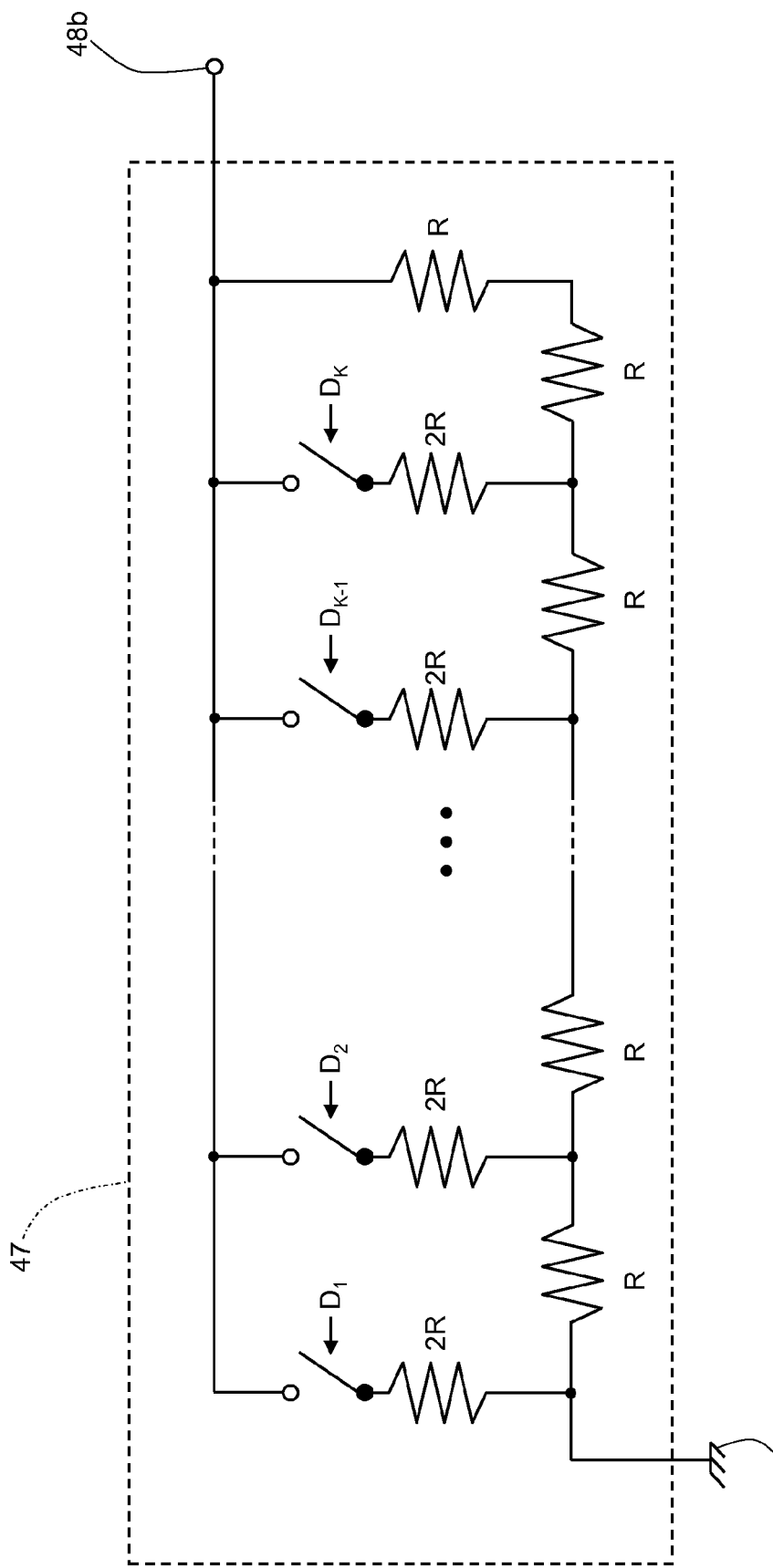
FIG. 4 shows a resistive network of a known type that can be used in the regulator circuit of FIG. 3.

The reference generation block 42 is provided by means of a low voltage DAC (Digital-to-Analog Converter) circuit, that includes a resistive network 47 having a variable resistance $R_{VAR}$, for example provided by means of an R-2R weighted resistance network, of a known type and illustrated for greater clarity and by way of non-limiting example in FIG. 4. The resistive network 47 receives at input a digital control signal $D_1, D_2, \ldots, D_{K-1}, D_K$, which represents a digital word and modulates the equivalent resistance value of the resistive network 47, thus modifying the voltage value of the first comparison signal $V_C$, as explained more fully in what follows.

The reference generation block 42 moreover includes an operational amplifier 48 of a non-inverting type, which has an amplification gain G, supplied by means of a low voltage supply (not illustrated) that provides the supply voltage $V_{DD}$, for example 1V. The operational amplifier 48 receives on a non-inverting input 48a a reference signal $V_{REF}$ (a stable voltage, having a value of, for example, 650 mV, generated by means of a band-gap circuit—not illustrated), receives on an inverting input 48b the analog signal generated at output by the resistive network 47, and supplies on an output 48c the first comparison signal $V_C$.

Finally, the reference generation block 42 includes a gain resistor 49, having a resistance value $R_G$, connected between the inverting input 48b and the output 48c of the operational amplifier 48. In this way, the gain G of the operational amplifier 48 is given by $G=(1+R_G/R_{VAR})$, whilst the voltage value of the first comparison signal $V_C$ is given by $V_C=V_{REF}\cdot(1+R_G/R_{VAR})$.

By controlling the resistive network 47 with digital control signals $D_1, D_2, \ldots, D_K$, it is possible to vary the resistance value $R_{VAR}$ seen on the inverting input of the operational amplifier 48, consequently varying the gain G of the operational amplifier 48 and hence the voltage value of the comparison signal $V_C$ supplied on the output 48c of the operational amplifier 48.

By varying the resistance value $R_{VAR}$, it is possible to vary the voltage value of the first comparison signal $V_C$ and vary accordingly the maximum value of the charge voltage $V_{OUT}$. The range of variation of the charge voltage $V_{OUT}$, as likewise its desired maximum value, depends upon the specific application (for example, the charge voltage $V_{OUT}$ can be made to vary by a value of ±12% with respect to the desired maximum value). The variation can be obtained by varying by a percentage value (for example, by ±12%) the resistive ratio $1+R_G/R_{VAR}$, or else by causing the comparison signal $V_C$ to vary by the percentage value.

The regulation block 44 of the regulator circuit 40 includes a plurality of transistors $T_1, T_2, \ldots, T_M$, for example MOSFETs of a P type, in diode configuration. Each transistor $T_1$-$T_M$ has in fact its own control terminal (gate terminal) connected to a first conduction terminal (drain terminal) of its own. Furthermore, each transistor $T_1$-$T_M$ includes a second conduction terminal (source terminal) and a bulk terminal. In particular, as illustrated in the figure, for each transistor $T_1$-$T_M$ the bulk terminal is biased at the voltage of the source terminal, according to a known biasing configuration.

The transistor $T_1$ is connected via its own drain terminal to a ground reference terminal GND and via its own source terminal to the drain terminal of the transistor $T_2$; the transistor $T_M$ is connected via its own source terminal to the output terminal 2b of the charge pump 2. As illustrated in the figure, connected in series with one another between the transistor $T_1$ and the transistor $T_M$ are a plurality of transistors $T_2$-$T_{M-1}$. In particular, the transistors $T_2$-$T_{M-1}$ are connected to one another in such a way that the drain (or source) terminal of each transistor $T_2$-$T_{M-1}$ is connected to the source (or drain) terminal of the transistor $T_2$-$T_{M-1}$ that follows (or precedes) it in the series connection.

The second comparison signal $V_R$, supplied at output from the regulation block 44 and received on the second input 46b of the comparator device 46, is taken on the source terminal of the transistor T1.

The number M of transistors of the regulation block 44 depends upon the maximum value of the charge voltage $V_{OUT}$ and upon the maximum value of regulation current $I_R$ that the charge pump 2 is required to supply to the regulation block 44. For example, if it is desired that the maximum value of charge voltage $V_{OUT}$ should be 12 V and that the maximum value of regulation current $I_R$ should be 1 µA, then a value of the comparison signal $V_C$ is chosen such that the current that would flow in the transistor $T_1$, if the transistor $T_1$ were biased with a voltage value equal to $V_C$, is 1 µA. It is assumed, for example, that the value of $V_C$ chosen in this way is 0.8 V. In this case, the number M of transistors of the regulation block 44 would be given by the ratio between the maximum value of charge voltage $V_{OUT}$ (12 V) and the value of the comparison signal $V_C$ (0.8 V), i.e., M=12/0.8=15.

In use, the regulation block 44 connected to the output 2b of the charge pump 2 acts as a load for the charge pump 2 itself. In particular, on the regulation block 44 there is set up a potential equal to the charge voltage $V_{OUT}$ at output from the charge pump 2 and there flows the regulation current IR.

It is expedient for the transistors $T_1$-$T_M$ to work, in steady-state conditions, in saturation. Consequently, the maximum value of the charge voltage $V_{OUT}$ must be such as to send the transistors $T_1$-$T_M$ into steady-state conditions of saturation.

Since the transistors $T_1$-$T_M$ are in diode configuration, on each of them there is set up one and the same potential drop equal to $V_{OUT}/M$ (i.e., the potential $V_{GS}$ between the gate terminal and source terminal of each transistor $T_1$-$T_M$ is equal to $V_{OUT}/M$). Assuming that all the transistors $T_1$-$T_M$ are the same as one another and biased in saturation, the drain current of each of them is given by $$I_d = \left(K \cdot \frac{W}{L}\right) \cdot (V_{GS} - V_t)^2,$$

where, for each transistor $T_1$-$T_M$, W is the channel width, L is the channel length, $V_{GS}$ is the potential between the gate terminal and the source terminal, $V_t$ is the threshold voltage, and $K=(\frac{1}{2} \cdot \mu \cdot C_{OX})$, where $C_{OX}$ is the capacitance of the gate oxide layer of the transistor (in the example of FIG. 3, a MOSFET), and $\mu$ is the mobility of the charge carriers.

The charge voltage $V_{OUT}$ increases until the potential $V_{GS}$ between the gate terminal and the source terminal of the transistors $T_1$-$T_M$ reaches a value equal to $-V_C$. For the voltage value, the regulation current $I_R$ is given by $$I_R = \left(K \cdot \frac{W}{L}\right) \cdot (-V_C - V_t)^2$$

Consequently, the charge voltage $V_{OUT}$ reaches a desired value (depending upon the specific application of the charge pump 2) when the second comparison signal $V_R$ assumes a value equal to the first comparison signal $V_C$. In this case, $V_{OUT}=V_C \cdot M$ (and in particular $V_R=V_C$) and, for a further increase of the charge voltage $V_{OUT}$, the signal for enabling charge transfer $V_{ON/OFF}$ on the output of the comparator device 46 switches in such a way as to drive into inhibition the charge pump 2, which will not cause a further increase in the charge voltage $V_{OUT}$ on its own output 2b.

The sizing of the transistors $T_1$-$T_M$ (sizing of W and L) depends, first of all, upon the regulation current $I_R$ desired for a given value of the first comparison signal $V_C$ and is strictly linked to the technology used. For example, if the aim is to obtain a regulation current $I_R$ of 1 μA, then:

$$I_R = \left(K \cdot \frac{W}{L}\right) \cdot (-V_C - V_t)^2 = 1 \ \mu A$$

Since $V_C$, $V_t$ and K are known, it is possible to determine the ratio W/L such that the regulation current $I_R$ is 1 μA.

An example of the sizing of W and L in a regulator circuit 40 used in an EEPROM in which the maximum value of charge voltage $V_{OUT}$ is 12.5 V, the voltage value of the first comparison signal $V_C$ is 833 mV, the value of the regulation current IR is 1 μA, and the number M of transistors $T_1$-$T_M$ is 15, is that W=2 μm and L=12 μm.

The regulator circuit 40 presents numerous advantages as compared to regulator circuits of a known type (for example, as compared to the regulator circuit 1 of FIG. 1). In particular, the current consumption of the regulator circuit 40 can be divided into two separate components: a first component drawn by the reference generation block 42 directly from the supply voltage $V_{DD}$, and a second component supplied by the charge pump 2 just to the regulation block 44. The current supplied by the charge pump 2 is, however, as has been said, affected by an inefficiency factor proper to the charge pump 2 that appears in a particularly evident way in the case of use of low supply voltages $V_{DD}$ (comprised, as has been said, between approximately 1 V and 1.4 V). Since, according to the embodiment of the regulator circuit 40 of FIG. 3, the current $I_R$ supplied by the charge pump 2 has a very low value (comprised between approximately 0.7 μA and 1.3 μA) and biases exclusively the regulation block 44, the regulator circuit 40 and the charge pump 2 can be used for low voltage applications without incurring in the problems described as regards questions of inefficiency of the charge pump 2.

In addition, since the only resistors present are used in the reference generation block 42, which is supplied directly by the supply voltage $V_{DD}$, the resistors can be provided with relatively low resistance values (a few hundred of kΩ), with consequent saving of area.

Furthermore, the regulator circuit 40 of FIG. 3 includes components that can be obtained in standard low voltage CMOS technology and does not require the implementation of costly components, such as for example Zener diodes according to the circuit of FIG. 2.

Finally, the use of the resistive network 47 enables a fine regulation of the first comparison signal $V_C$; in this way, also the desired level of the charge voltage $V_{OUT}$ can be finely modified during use of the regulation device 40, rendering the charge pump 2 governed by the regulator circuit 40 particularly flexible and suitable for a plurality of uses (for example, the same charge pump can be used for carrying out operations of writing or erasure on a single memory or on different memories, each requiring different writing and erasure voltages).

The regulator circuit 40 of FIG. 3 presents, however, problems of a dynamic nature. In particular, a possible offset intrinsic to the comparison device 46 (for example, linked to the frequency response, such as a delay in the switching of the output signal of the comparison device 46) is re-proposed on the output 46c of the comparison device 46, amplified and added to the first comparison signal $V_C$. The problems are solved by a regulator circuit 50 of the type illustrated in FIG. 5, according to a further embodiment of the present disclosure.

In detail, the regulator circuit 50 includes, as has been described with reference to the generator circuit 40 and illustrated in FIG. 3, the reference generation block 42 (here not described further). The regulator circuit 50 moreover includes the comparator device 46, configured for comparing the voltage values of the first and second comparison signals $V_C$ and $V_R$ with one another and generating at output the signal for enabling charge transfer $V_{ON/OFF}$, supplied to the charge pump 2. The charge voltage $V_{OUT}$ generated at output by the charge pump 2 is supplied at input to a regulation block 52, analogous to the regulation block 44 of the regulator circuit 40 of FIG. 3 (and hence not described any further in detail here). However, according to the embodiment of FIG. 5, the regulation block 52 includes a number of transistors $T_1$-$T_{M-1}$ equal to M-1. The regulation block 52 supplies at output the second comparison signal $V_R$, in this case taken on the drain terminal of the transistor $T_1$.

The regulator circuit 50 moreover includes a current mirror structure 54, having the function of overcoming the problems of a dynamic nature that afflict the regulator circuit 40, by mirroring a control current $I_C$ present on the output of the operational amplifier 48 onto the regulation block 52.

A control transistor $T_0$ is connected, via a source terminal of its own, to the output 48c of the operational amplifier 48, whilst the drain terminal of the control transistor $T_0$ is connected to the current mirror structure 54. The drop in potential on the control transistor $T_0$, due to the presence of the first comparison signal $V_C$, defines the amount of the control current $I_C$. It is evident that the control transistor $T_0$ must be sized appropriately, for example according to what has already been described with reference to the transistors $T_1$-$T_M$ of FIG. 3 (in this case, with $I_C$=$I_R$).

The current mirror structure 54 includes: a first current generator 56, which has a first terminal connected to the supply voltage $V_{DD}$ and a second terminal and is configured for generating a current $I_{Z1}$; and a second current generator 58, which has a first terminal connected to the supply voltage $V_{DD}$ and a second terminal and is configured for generating a current $I_{Z2}$. The current mirror structure 54 moreover includes a biasing structure 60, including a first biasing transistor M1 and a second biasing transistor M2, for example MOSFETs of an N type, where the first biasing transistor M1 is connected via a drain terminal to the second terminal of the first current generator 56 and via a source terminal to the drain terminal of the control transistor $T_0$, whilst the second biasing transistor M2 is connected, via a drain terminal of its own, to the drain terminal of the transistor $T_1$ of the regulation block 52 and, via a source terminal of its own, to the second terminal of the second current generator 58. Finally, the current mirror structure 54 includes a current mirror 62, including a first mirror transistor M3 and a second mirror transistor M4, for example MOSFETs of an N type. The first mirror transistor M3 is connected, via a drain terminal of its own, to the drain terminal of the control transistor $T_0$ and hence also to the source terminal of the first biasing transistor M1, and, via a source terminal to the ground reference terminal GND. The second mirror transistor M4 is connected, via a drain terminal of its own, to the source terminal of the second biasing transistor M2 and, hence, also to the second terminal of the current generator 58, and, via a source terminal of its own, to the ground reference terminal GND.

The first and second biasing transistors M1 and M2 are sized so as to be the same as one another. The values of width W and length L of the channel of the biasing transistors M1 and M2 are chosen as a compromise between maximum dimensions, which are limited by the speed of response of the current mirror structure 54 and by the space available for its physical implementation, and minimum dimensions, which are limited by the technology used. For instance, the first and second biasing transistors M1 and M2 can be sized so as to have a channel width W of their own of 6 μm and a channel length L of 1 μm. Also the first and second mirror transistors M3 and M4 are sized so as to be the same as one another, for example having a channel width W of 3 μm and a channel length L of 10 μm.

The gate terminals of the first and second biasing transistors M1 and M2 are biased at a voltage value equal to the voltage value of the reference signal $V_{REF}$, whilst the gate terminals of the first and second mirror transistors M3 and M4 are biased via the current $I_{Z1}$, taken on the second terminal of the current generator 56.

Finally, the control transistor $T_0$ is in quasi-diode configuration, i.e., having its own gate terminal connected to the ground terminal GND and its own drain terminal biased at a very low voltage (preferably comprised between 100 mV and 200 mV).

In use, in fact, the drain terminal of the control transistor $T_0$ is biased by means of the first biasing transistor M1 at a voltage sufficiently low as to ensure operation in saturation of the control transistor $T_0$. The first biasing transistor M1 is controlled via the reference voltage $V_{REF}$, for example with a value of 650 mV. Assuming that the first biasing transistor M1 has a threshold voltage value of 500 mV, the source terminal of the first biasing transistor M1, and hence the drain terminal of the control transistor $T_0$, are biased at a voltage of 150 mV. It is evident that, in the case where the reference voltage $V_{REF}$ used is excessively high in order to bias the control transistor $T_0$ in quasi-diode steady-state conditions, the first biasing transistor M1 can be biased with a voltage having an appropriate value (for example, comprised between 500 mV and 700 mV) generated outside the regulator circuit 50 and different from the reference voltage $V_{REF}$.

In the first mirror transistor M3 there consequently flows a current given by the sum of the control current $I_C$ and of the current $I_{Z1}$. Likewise, in the fourth mirror transistor M4 there flows a current given by the sum of the regulation current $I_R$ (coming from the regulation block 52) and the current $I_{Z2}$. The current mirror 62 imposes the need for the current that flows in the first mirror transistor M3 (i.e., $I_C$+$I_{Z1}$) to be equal to the current that flows on the second mirror transistor M4 (i.e., $I_R$+$I_{Z2}$). By configuring the first and second current generators 56, 58 in such a way that they will supply the same current ($I_{Z1}$=$I_{Z2}$), then the current mirror 62 imposes the need for the regulation current $I_R$ to be equal to the control current $I_C$. In this way, injected in the branch provided by the series of transistors $T_1$-$T_{M-1}$ of the regulation block 52 is the same current that flows in the control transistor $T_0$.

Even though the second biasing transistor M2 is not strictly necessary for the purposes of operation of the regulator circuit 50, it has, however, been found that in its absence (and hence in the absence of the biasing structure 60), the current mirrored by the first mirror transistor M3 on the second mirror transistor M4 is not exactly $I_C$+$I_{Z1}$. This occurs because, in the absence of the second biasing transistor M2, the drain terminal of the second mirror transistor M4 is not biased at the same potential as the drain terminal of the first mirror transistor M3.

The value of the current $I_{Z1}$ and of the current $I_{Z2}$ can be chosen arbitrarily; however, to limit the consumption levels and not damage the regulator circuit 50, it may be convenient to choose low current values $I_{Z1}$ and $I_{Z2}$, for example close to the value assumed by $I_C$ (in the region of approximately 1 μA).

When the charge voltage $V_{OUT}$ increases beyond the voltage value of the first comparison signal $V_C$, there is an increase of the voltage value of the second comparison signal $V_R$, in so far as on the second mirror transistor M4 there cannot flow a current higher than $I_C$+$I_{Z2}$. For values of the charge voltage $V_{OUT}$ lower than the desired value, the drop in potential on each transistor $T_1$-$T_{M-1}$ is lower than the voltage value of the first comparison signal $V_C$; with the increase of the value of charge voltage $V_{OUT}$, also the voltage drop on the transistors $T_1$-$T_{M-1}$ increases until it reaches the voltage value of the first comparison signal $V_C$. The voltage drop between the source and gate terminals of the transistors $T_1$-$T_{M-1}$ cannot exceed the voltage value of the first comparison signal $V_C$ in so far as the maximum current value that the second mirror transistor M4 can supply to the regulation block 52 is given by the maximum value of the regulation current Ic. When the charge voltage $V_{OUT}$ reaches the desired value given by $V_{OUT}=V_C \cdot M$, the voltage value of the second comparison signal $V_R$ is equal to $(V_C \cdot M - V_C \cdot (M-1))$, i.e., equal to $V_C$. For a further increase $V\delta$ of the charge voltage $V_{OUT}$, the voltage value of the second comparison signal $V_R$ will be given by $(V_C \cdot M + V\delta) - (V_C \cdot (M-1))$, i.e., equal to $V_C + V\delta$, thus switching the signal for enabling charge transfer $V_{ON/OFF}$ generated by the comparator device 46 in such a way as to drive into inhibition the charge pump 2, which will not cause any further increase of the charge voltage $V_{OUT}$ on its own output 2b.

When the voltage value of the second comparison signal $V_R$ drops once again below the value of the first comparison signal $V_C$ (for example, because the value of the charge voltage $V_{OUT}$ has decreased or because the voltage value of the first comparison signal $V_C$ has been increased through a command sent to the resistive network 47), the comparator device 46 generates at output a signal for enabling charge transfer $V_{ON/OFF}$ such as to govern the charge pump 2 in such a way that the value of charge voltage $V_{OUT}$ will be once again increased.

Figure 5:
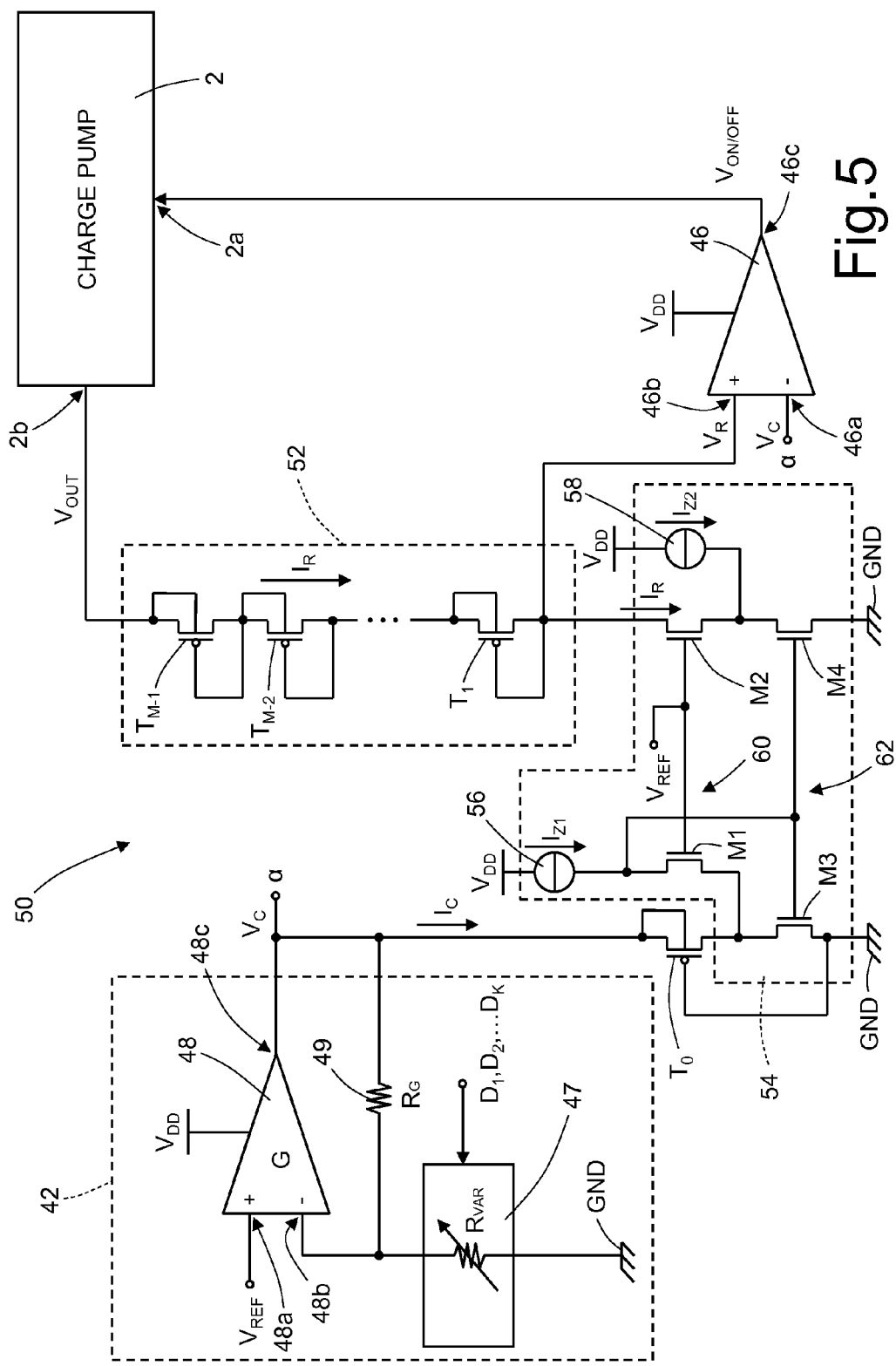
FIG. 5 shows a voltage regulator circuit for a charge pump according to a further embodiment of the present disclosure.

The regulator circuit 50 of FIG. 5 presents numerous advantages. In particular, in addition to the advantages already illustrated with reference to the regulator circuit 40 of FIG. 3, the regulator circuit 50 overcomes the problems of a dynamic type linked to the possible presence of an offset internal to the comparison device 46 due to the use of the mirror block 54. The mirror block 54 in fact is configured for mirroring the control current $I_C$ generated by the reference generation block 42, on the basis of a static voltage signal (the supply signal $V_{DD}$), onto the regulation block 52. On each of the transistors $T_1$-$T_{M-1}$ there is consequently set up, in steady-state operating conditions with $I_R = I_C$, the same potential $V_C$ that is set up on the control transistor $T_0$. It is consequently evident that, even in the case where an offset error internal to the comparison device 46 were to be present, it would not be fed back onto the transistors $T_1$-$T_{M-1}$ and hence the error would not be proposed on the second input 46b of the comparison device 46, and consequently would not be amplified.

Further advantages of the present disclosure are given in what follows.

The use of MOSFETs of a P type to provide the regulation block 44 (FIG. 3) or the regulation block 52 (FIG. 5) enables a regulator circuit 40 or, respectively, 50 to be obtained, which is very compact as compared to a resistive-divider regulator circuit of the type illustrated in FIG. 1. In particular, the applicant has estimated that, to provide a regulator circuit configured to function with a reduced current consumption, in the region of approximately 1 µA, a resistive-divider regulator circuit would require an occupation of area that can be estimated at around 10000 µm$^2$, whereas a regulator circuit of the type illustrated in FIG. 3 or FIG. 5 would enable a saving of area of approximately 80%, requiring an occupation of area that can be estimated at around 2000 µm$^2$.

The regulator circuit 50 according to the present disclosure moreover possesses a high immunity to temperature variations. The following table shows the maximum variation of the level of regulation as a function of variable operating conditions, in a range of supply voltage $V_{DD}$ comprised between 1 V and 1.35 V, and in a temperature range comprised between −40° C. and 125° C. As may be noted, the difference between the maximum value and the minimum value is negligible, equal to 0.4% of the nominal value.

|  | Regulation level [V] | Temp [° C.] | $V_{DD}$ [V] |
|---|---|---|---|
| Minimum value | 12.42 | −40 | 1.35 |
| Nominal value | 12.45 | 25 | 1.2 |
| Maximum value | 12.47 | 42 | 1 |

Figure 6:
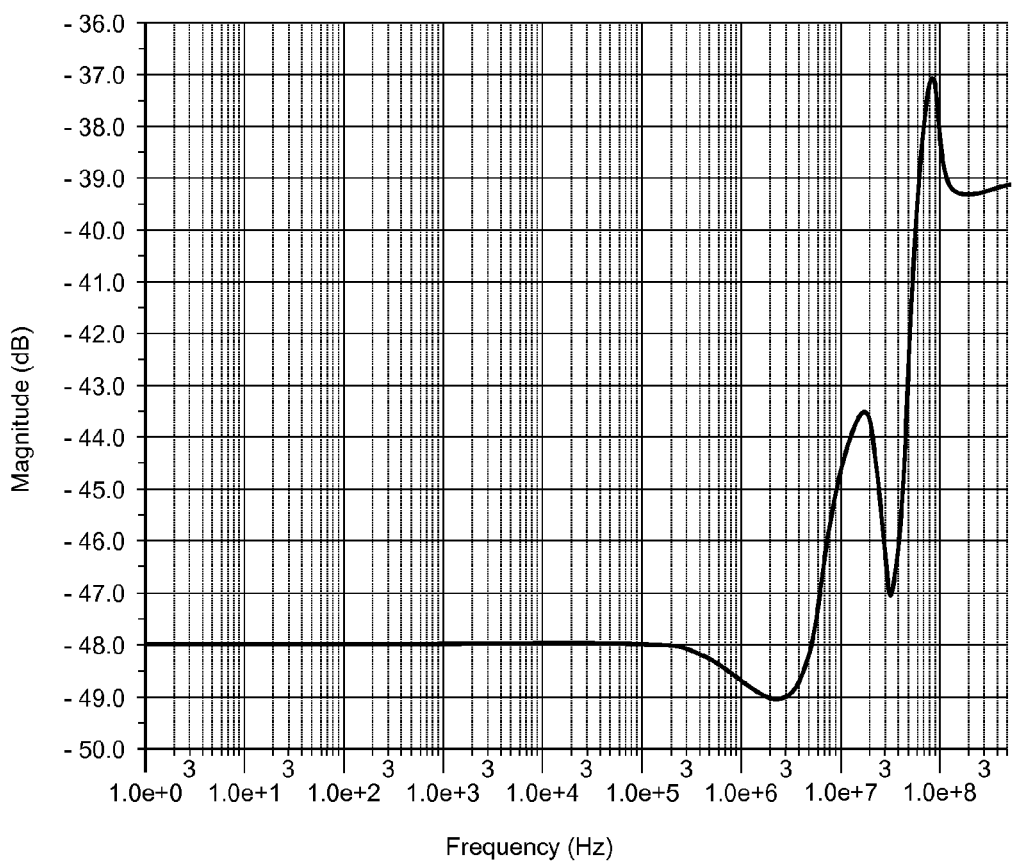
FIG. 6 shows the plot of the PSRR (Power-Supply Rejection Ratio) corresponding to the output signal of the regulator circuit of FIG. 5.

FIG. 6 shows the plot of the PSRR (Power Supply Rejection Ratio) of the level of regulation of the charge voltage $V_{OUT}$. The maximum value of 37 dB is at 6.8 MHz. This means that for a noise of the supply voltage $V_{DD}$ of, for example, approximately 100 mV, the noise induced in the regulation of the charge voltage $V_{OUT}$ is 1.4 mV, i.e., equal to 0.01% of the value of the charge voltage $V_{OUT}$. The induced noise can consequently be considered negligible.

Figure 7:
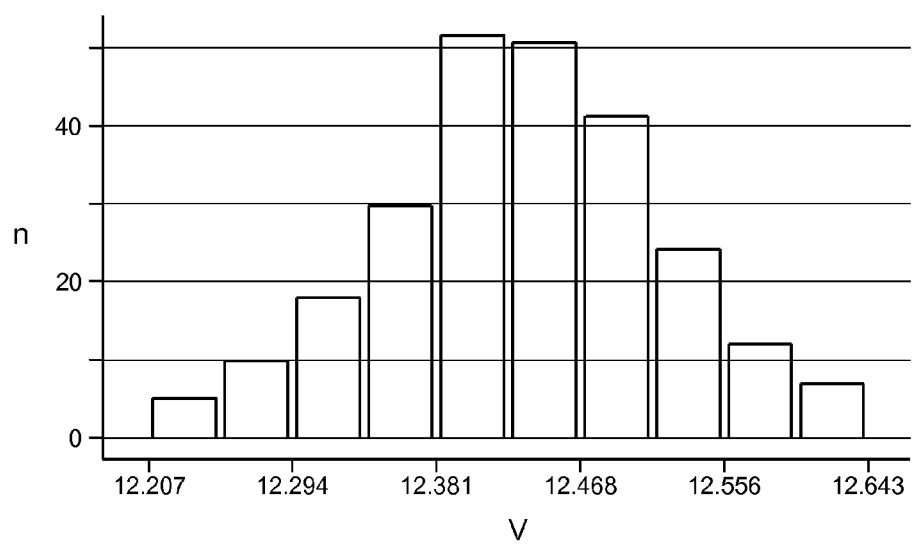
FIG. 7 shows the statistical distribution of the level of regulation corresponding to the regulator circuit of FIG. 5 as a function of process variations and undesirable misalignment effects.

FIG. 7 shows a distribution of the values of oscillation of the charge voltage $V_{OUT}$ (obtained via Monte Carlo simulation) when the desired value of the latter is set at 12.45 V. In this case, the standard deviation has been calculated to be approximately 85 mV and the variance to be approximately 7.2 mV. The values are caused by the effects of statistical variations of the process used for implementation of the disclosure (thickness of the oxides, variations of resistivity, negative effects due to mismatch, etc.) on the circuit operation. It may be inferred from FIG. 7 that, with a fair level of probability (99.73%), the value of regulation varies by approximately ±2% with respect to the nominal value. The result can be considered good for the purposes of evaluation of the independence of operation of the disclosure as a function of the production process spread.

Figure 8:
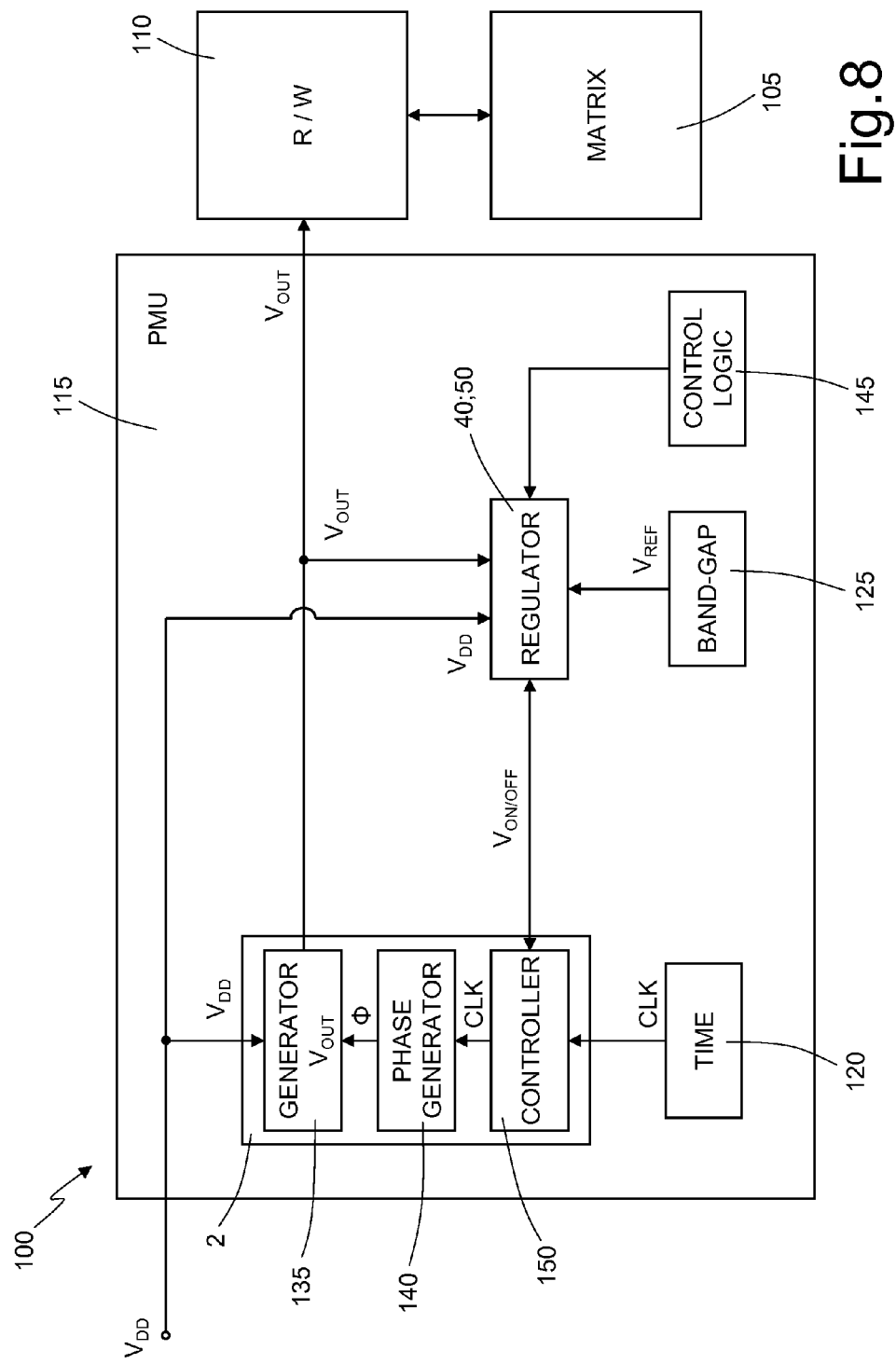
FIG. 8 shows a memory that includes the regulator circuit of FIG. 3 or FIG. 5.

FIG. 8 shows a portion of a memory 100, for example an EPROM of a flash type, integrated on a chip of semiconductor material, and including an array 105 of memory cells. The array 105 is coupled with a read/write unit 110, which includes all the components (such as for example sense amplifiers, comparators, reference cells, pulse generators, and the like) used for updating the contents of the memory cells selected. A power management unit (PMU) 115 receives an external supply voltage $V_{DD}$ (for example, a low voltage of approximately 1 V for a reference potential, or ground). The PMU 115 generates a plurality of internal operating voltages $V_1$-$V_N$, which are supplied to the read/write unit 110 (to implement different operations on the array 105, such as erasure, programming, soft programming, and reading); the internal operating voltages $V_1$-$V_N$ are spread over an extensive operating range, for example comprised between 3 V and 15 V.

The PMU 115 includes a timing unit 120, which generates a clock signal CLK, and a band-gap circuit 125, which supplies the reference signal $V_{REF}$. The PMU 115 moreover includes the charge pump 2, including a charge voltage generation circuit 135, configured for generating one or more of the internal operating voltages $V_1$-$V_N$ starting from the supply voltage $V_{DD}$. As is known, the operations of the charge pump 2 lead to the continuous accumulation and transfer of electrical charge in one or more capacitors, for example under the control of multiple phase signals (illustrated in the figure with the symbol ($\Phi_i$) provided by a phase generator 140.

The PMU 115 moreover includes the regulator circuit 40 of FIG. 3 or the regulator circuit 50 of FIG. 5, configured for receiving at input the reference signal $V_{REF}$, generated by the band-gap circuit 125, and the digital control signal $D_1$, $D_2$, ..., $D_K$, generated by an appropriate control logic 145. The regulator circuit 40 or 50 supplies at output, as has been said, the signal for enabling charge transfer $V_{ON/OFF}$. The signal for enabling charge transfer $V_{ON/OFF}$ is then supplied at input to a controller block 150, which transmits the clock signal CLK generated by the timing unit 120 to the phase generator 140 when the signal for enabling charge transfer $V_{ON/OFF}$ is asserted, and interrupts the transmission of the clock signal CLK when the signal for enabling charge transfer $V_{ON/OFF}$ is deasserted.

Finally, it is clear that modifications and variations may be made to the regulator circuit described and illustrated herein, without thereby departing from the sphere of protection of the present disclosure, as defined in the annexed claims.

Furthermore, the resistive network 47 can be provided by means of any other known DAC architecture, for example a weighted resistance DAC network, or by means of variable resistors of a known type.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage regulator, comprising:
   a variable comparison voltage generator configured to generate a comparison voltage;
   a partition branch having a plurality of active devices of a resistive type and configured to receive an operating voltage and to supply an intermediate voltage correlated to the operating voltage;
   a comparator configured to receive the comparison voltage and the intermediate voltage and to supply a regulation signal;
   a first current generator coupled to the variable comparison voltage generator and configured to receive the comparison voltage and to generate a controlled current correlated to the comparison voltage; and
   a current mirror circuit coupled to the first current generator and configured to supply to the partition branch a regulated current of a value proportional to the controlled current.

2. The voltage regulator of claim 1, wherein each active device of the plurality of active devices is a transistor in diode configuration and is coupled in series with another active device of the plurality of active devices.

3. The voltage regulator of claim 1, wherein the variable comparison voltage generator is a variable resistance digital-to-analog converter.

4. The voltage regulator of claim 1, wherein the current mirror circuit includes:
   a first mirror transistor having a drain terminal coupled to the first current generator and a source terminal coupled to a ground-reference line; and
   a second mirror transistor having a drain terminal coupled to the partition branch and a source terminal coupled to the ground-reference line, the first mirror transistor and second mirror transistor each having a respective control terminal coupled to one another.

5. The voltage regulator of claim 4, wherein the first current generator is a transistor having a first conduction terminal coupled to the variable comparison voltage generator, a second conduction terminal coupled to the drain terminal of the first mirror transistor, and a control terminal coupled to the ground reference line.

6. The voltage regulator of claim 5, further including:
   a biasing structure having a first biasing transistor and a second current generator, the first biasing transistor having a first conduction terminal coupled to the second current generator and a second conduction terminal coupled to the second conduction terminal of the first current generator;
   a second biasing transistor having a first conduction terminal coupled to the partition branch and a second conduction terminal coupled to the drain terminal of the second mirror transistor; and
   a third current generator coupled to the drain terminal of the second mirror transistor.

7. A method, comprising:
   generating a comparison voltage by means of a variable comparison voltage generator;
   generating an intermediate voltage using a partition branch, the intermediate voltage dependent upon the operating voltage;
   comparing the comparison voltage and the intermediate voltage;
   generating a regulation signal on the basis of the comparison of the comparison voltage and the intermediate voltage;
   generating a controlled current by controlling in conduction a first current generator using the comparison voltage; and
   generating on the partition branch a regulated current of a value proportional to the controlled current by mirroring the controlled current on the portion branch with a current mirror circuit.

8. The regulation method of claim 7, wherein the first current generator is a transistor having a first conduction terminal, a second conduction terminal, and a control terminal, and wherein controlling the first current generator in conduction includes:
   controlling the first conduction terminal with the comparison voltage; and
   controlling the second conduction terminal with a biasing voltage having a value intermediate between the value of the ground voltage and the value of the comparison voltage.

9. A memory device comprising:
   an array of memory cells;
   a read/write circuit coupled to the array of memory cells;
   a regulated voltage generator configured to generate an operating voltage; and
   a circuit configured to manage a supply voltage coupled to the read/write circuit and including:
      a reference voltage generator;
      a voltage regulator coupled to the reference voltage generator and to the regulated voltage generator and including:
         a variable comparison voltage generator configured to generate a comparison voltage;
         a partition branch having a plurality of active devices of a resistive type configured to receive the operating voltage and supply at output an intermediate voltage correlated to the operating voltage; and a comparator configured to receive the comparison voltage and the intermediate voltage and to supply a regulation signal;

a control logic block coupled to the voltage regulator and configured to control the voltage regulator in the generation of a regulation signal, the regulation signal configured to control the regulated voltage generator in the generation of the operating voltage;

a first current generator coupled to the variable comparison voltage generator and configured to generate a controlled current correlated to the comparison voltage; and a current mirror circuit configured to supply to the partition branch a regulated current of a value proportional to the controlled current.

10. The memory device of claim 9, wherein each active device of the plurality of active devices is a transistor in diode configuration and is coupled in series with another active device of the plurality of active devices.

11. The memory device of claim 9, wherein the variable comparison voltage generator is a variable resistance digital-to-analog converter.

12. The memory device of claim 9, wherein the current mirror circuit includes:

a first mirror transistor having a drain terminal coupled to the first current generator and a source terminal coupled to a ground-reference line; and a second mirror transistor having a drain terminal coupled to the partition branch and a source terminal coupled to the ground-reference line, the first mirror transistor and second mirror transistor each having a respective control terminal coupled to one another.

13. The memory device of claim 12, wherein the first current generator is a transistor having a first conduction terminal coupled to the output of the variable comparison voltage generator, a second conduction terminal coupled to the drain terminal of the first mirror transistor, and a control terminal coupled to the ground reference line.

14. The memory device of claim 13, further including:

a biasing structure having:

a first biasing transistor and a second current generator, the first biasing transistor having a first conduction terminal coupled to the second current generator and a second conduction terminal coupled to the second conduction terminal of the first current generator;

a second biasing transistor having a first conduction terminal coupled to the partition branch and a second conduction terminal coupled to the drain terminal of the second mirror transistor; and a third current generator coupled to the drain terminal of the second mirror transistor.

15. A circuit, comprising:

a regulated voltage generator circuit;

a circuit configured to generate a variable comparison voltage;

a partition circuit configured to generate an intermediate voltage that is dependent on an operating voltage; and a comparison circuit configured to compare the variable comparison voltage and the intermediate voltage and to generate a control signal;

a first current generator configured to generate a controlled current correlated to the comparison signal; and a current mirror circuit configured to supply to the partition circuit a regulated current of a value proportional to the controlled current.

16. The circuit of claim 15, wherein the partition circuit includes a plurality of active devices of a resistive type.

17. A voltage regulator, comprising:

a variable comparison voltage generator configured to generate a comparison voltage;

a partition branch having a plurality of active devices of a resistive type and configured to receive an operating voltage and to supply an intermediate voltage correlated to the operating voltage;

a comparator configured to receive the comparison voltage and the intermediate voltage and to supply a regulation signal;

a first current generator configured to generate a controlled current correlated to the comparison voltage, the first current generator having a transistor with a first conduction terminal coupled to the output of the variable comparison voltage generator, a second conduction terminal, and a control terminal coupled to the ground reference line;

a biasing structure including a first biasing transistor and a second current generator, the first biasing transistor having a first conduction terminal coupled to the second current generator and a second conduction terminal coupled to the second conduction terminal of the transistor of the first current generator; and a current mirror circuit configured to supply to the partition branch a regulated current of a value proportional to the controlled current, the current mirror including:

a first mirror transistor having a drain terminal coupled to the second conduction terminal of the transistor of the first current generator and a source terminal coupled to a ground-reference line; and a second mirror transistor having a drain terminal coupled to the partition branch and a source terminal coupled to the ground-reference line, the first mirror transistor and second mirror transistor each having a respective control terminal coupled to one another.

18. The voltage regulator of claim 17, wherein each active device of the plurality of active devices is a transistor in diode configuration and is coupled in series with another active device of the plurality of active devices.

19. The voltage regulator of claim 17, wherein the variable comparison voltage generator is a variable resistance digital-to-analog converter.

20. The voltage regulator of claim 17, wherein the biasing structure includes:

a second biasing transistor having a first conduction terminal coupled to the partition branch and a second conduction terminal coupled to the drain terminal of the second mirror transistor; and a third current generator coupled to the drain terminal of the second mirror transistor.

21. A method for regulation of an operating voltage generated by a regulated-voltage generator, comprising:

generating a comparison voltage using a variable comparison voltage generator;

generating an intermediate voltage that is dependent upon the operating voltage using a partition branch;

comparing the comparison voltage and the intermediate voltage;

generating a regulation signal on the basis of a result of the comparing of the comparison voltage and the intermediate voltage;

controlling in conduction a first current generator using the comparison voltage and generating a controlled current by:

controlling a control terminal of a transistor in the first current generator with a ground voltage;

controlling a first conduction terminal of the transistor in the first current generator with the comparison voltage; and controlling a second conduction terminal of the transistor in the first current generator with a biasing voltage having a value intermediate between the value of the ground voltage and the value of the comparison voltage; and mirroring on the partition branch using a current mirror circuit the controlled current and generating on the partition branch a regulated current of a value proportional to the controlled current.

22. The method of claim 21, comprising varying a resistance in a digital-to-analog converter in the variable comparison voltage generator to generate the comparison voltage.

23. A memory device comprising:
an array of memory cells;
a read/write circuit coupled to the array of memory cells;
a regulated voltage generator configured to generate an operating voltage; and
a circuit configured to manage a supply voltage coupled to the read/write circuit and including:
    a reference voltage generator;
    a voltage regulator coupled to the reference voltage generator and to the regulated voltage generator and including:
        a variable comparison voltage generator configured to generate a comparison voltage;
        a partition branch including a plurality of active devices of a resistive type configured to receive the operating voltage and supply at output an intermediate voltage correlated to the operating voltage; and
        a comparator configured to receive the comparison voltage and the intermediate voltage and to supply a regulation signal for the regulated voltage generator;
    a control logic block coupled to the voltage regulator and configured to control the voltage regulator in the generation of the regulation signal, the regulation signal in turn controlling the regulated voltage generator in the generation of the operating voltage;
    a first current generator coupled to the variable comparison voltage generator and configured to generate a controlled current correlated to the comparison voltage, the first current generator is a transistor having a first conduction terminal coupled to the output of the variable comparison voltage generator, a second conduction terminal, and a control terminal coupled to the ground reference line;
    a biasing structure that includes a first biasing transistor and a second current generator, the first biasing transistor having a first conduction terminal coupled to the second current generator and a second conduction terminal coupled to the second conduction terminal of the first current generator transistor; and
    a current mirror circuit configured to supply to the partition branch a regulated current of a value proportional to the controlled current, the current mirror circuit including:
        a first mirror transistor having a drain terminal coupled to the second conduction terminal of the first current generator transistor and a source terminal coupled to a ground reference line; and
        a second mirror transistor having a drain terminal coupled to the partition branch and a source terminal coupled to the ground reference line, the first mirror transistor and second mirror transistor each having a respective control terminal coupled to one another.

24. The memory device of claim 23, wherein the biasing structure includes:
a second biasing transistor having a first conduction terminal coupled to the partition branch and a second conduction terminal coupled to the drain terminal of the second mirror transistor; and
a third current generator coupled to the drain terminal of the second mirror transistor.

* * * * *